(12) United States Patent
Liang et al.

(10) Patent No.: US 8,378,714 B2
(45) Date of Patent: Feb. 19, 2013

(54) 5V TOLERANT CIRCUIT FOR CML TRANSCEIVER IN AC-COUPLE

(75) Inventors: Xu Liang, Shanghai (CN); Lei Kai, Shanghai (CN); Bi Han, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 411 days.

(21) Appl. No.: 12/829,087

(22) Filed: Jul. 1, 2010

(65) Prior Publication Data

US 2012/0001671 A1  Jan. 5, 2012

(51) Int. Cl.
*H03K 19/094* (2006.01)
(52) U.S. Cl. .............. 326/83; 326/81; 326/87; 326/113; 326/115; 327/109; 327/112; 327/333
(58) Field of Classification Search .............. 326/80–83, 326/86–87, 112–113, 115; 327/108–109, 327/112, 333
See application file for complete search history.

(56) References Cited

U.S. PATENT DOCUMENTS

| | | | | |
|---|---|---|---|---|
| 5,959,492 | A * | 9/1999 | Khoury et al. ................. | 327/389 |
| 6,847,225 | B2 * | 1/2005 | Viehmann et al. .............. | 326/30 |
| 6,894,536 | B2 * | 5/2005 | Martin et al. ................... | 326/63 |
| 2005/0264321 | A1 * | 12/2005 | Lee ................................. | 326/115 |
| 2007/0296461 | A1 * | 12/2007 | Wong et al. ..................... | 326/82 |
| 2008/0001633 | A1 * | 1/2008 | Narathong et al. ............. | 326/87 |
| 2008/0197906 | A1 * | 8/2008 | Mei et al. ........................ | 327/333 |

OTHER PUBLICATIONS

VESA DisplayPort Standard, Version 1, Revision 1a, Jan. 11, 2008.

* cited by examiner

*Primary Examiner* — Jason M Crawford
(74) *Attorney, Agent, or Firm* — Hayes and Boone LLP

(57) ABSTRACT

A high voltage tolerant transceiver operating at a low voltage is provided, including two input/output pads to receive a receive signal and transmit a transmit signal; a transmitter block to transmit the transmit signal; a receiver block to receive the receive signal and provide an amplified signal; at least one of the transmitter block and the receiver block further comprising at least two NMOS transistors having their gate coupled to a low power supply to receive the low voltage, their substrate coupled to ground, and their source coupled to the input/output pad. Also provided is a circuit to isolate the output of a transmitter from high voltages, including a first transistor and a second transistor. Also provided is a substrate isolating circuit, including a first transistor, a second transistor, and a third transistor so that the substrate voltage is isolated from a high voltage in the pads. Further provided is a bias isolating circuit so that an input bias voltage is isolated from a high voltage in the pads.

10 Claims, 6 Drawing Sheets

US 8,378,714 B2

5V TOLERANT CIRCUIT FOR CML TRANSCEIVER IN AC-COUPLE

BACKGROUND

1. Field of the Invention

The embodiments described herein relate generally to differential signal amplifiers for use in transceiver circuits; and more particularly, to high voltage tolerant circuits for Current Mode Logic (CML) transceiver circuits that support different generations of interfaces.

2. Description of Related Art

Current mode logic (CML) transceivers are widely used in high speed digital applications. Some applications of CML circuits include serializer-deserializer (SerDes) circuits for high speed data transmission links. Typically under current trends, a situation is encountered where circuits having different specifications need to be coupled to one another. Furthermore, while current trends push towards circuits operating at lower supply voltages, there are still components in a system that may operate at higher supply voltages. It is often the case that an AC-coupled CML transceiver working with input signals having a supply voltage of 2.5 V (thus the signal itself being less than or equal to 2.5 V) may be connected to a circuit working with a 5V supply. Under current technologies, a first circuit working with a lower supply voltage specification may not be protected against signals coming from a second circuit having a higher supply voltage, generating a signal having voltage well above the specification of the first circuit, or "signal spikes." In such an occurrence, the signal spike may over stress the components in the first circuit, leading to malfunction, signal distortion, and eventually catastrophic damage to the first circuit. Some of the components that may be affected in the first circuit are MOSFETs and diodes where the PN junctions may be driven beyond their breakdown voltage.

What is needed is a transceiver circuit that operates at lower supply voltage values and that may be immune to higher voltage signals coming from other circuits having a higher supply voltage.

SUMMARY

A high voltage tolerant transceiver operating at a low voltage is provided, the transceiver including at least two input/output pads to receive a receive signal and transmit a transmit signal; a transmitter block to transmit the transmit signal; a receiver block to receive the receive signal and provide an amplified signal; at least one of the transmitter block and the receiver block further comprising at least two NMOS transistors having their gate coupled to a low power supply to receive the low voltage, their substrate coupled to ground, and their source coupled to the input/output pad.

Also provided is a circuit to isolate the output of a transmitter from high voltages. The circuit including a first transistor with substrate coupled to ground, gate coupled to a low voltage, source coupled to a positive output pad, and drain coupled to an output of the transmitter device; and a second transistor with substrate coupled to ground, gate coupled to a low voltage, source coupled to a negative output pad, and drain coupled to an output of the transmitter device.

Also provided is a substrate isolating circuit. The substrate isolating circuit including a first transistor with gate coupled through a resistor to ground and source coupled to a low voltage; a second transistor with gate coupled to the low voltage, source coupled to the drain of the first transistor, and drain coupled to a pad; and a third transistor with gate coupled to the low voltage, source coupled to the gate of the first transistor, and drain coupled to the pad; wherein a substrate voltage is supplied by the drain of the first transistor, and the substrate voltage is isolated from a high voltage in the pad.

Further provided is a bias isolating circuit including a first transistor with gate coupled to a low voltage, source coupled through a resistor to ground and drain coupled to a pad; a second transistor with gate coupled through the resistor to ground, drain coupled to an input bias voltage, and substrate coupled to the low voltage; a third transistor with gate coupled through the resistor to ground, drain coupled to the low voltage, and substrate coupled to ground; wherein a bias voltage is supplied by the sources of the second and third transistors coupled together, and the input bias voltage is isolated from a high voltage in the pad.

These and other embodiments of the present invention are further described below with reference to the following figures.

BRIEF DESCRIPTION OF THE DRAWINGS

In the figures, elements having the same reference number have the same or similar functions.

DETAILED DESCRIPTION OF THE DRAWINGS

Current technological trends in digital circuitry push toward devices having lower supply voltage requirements. This trend is fostered by the need to make more efficient use of energy resources, and the desire to prevent electromagnetic interference between devices, which are closer to one another as integration increases, scale reduces, and users multiply. As a result, it is often the case that a variety of circuits having different specifications need to be linked to one another. Thus, recently manufactured devices may be exposed to higher voltage signal spikes generated by older devices.

In digital signal communication, as trends push for lower signal voltages and greater bandwidth devices, differential signal communication has become more widely used. Differential signaling helps reduce grounding issues, increases the speed of data transmission, and increases the immunity of the transmission channels to external interference and noise. In differential signal amplification, one of the issues that arise is the occurrence of common voltage amplification, which is undesirable since it has the effect of saturating the amplification circuit, thus distorting the signal. To mitigate common voltage problems, differential signaling circuits often operate in Alternate-Current (AC) coupling mode. Other advantage of differential signals is their tolerance to ground offsets, especially for highly integrated circuitry, where ground loops may be a common occurrence.

Due to their susceptibility to interference and noise, high speed transmission links and circuits may find it more convenient to use differential signaling schemes. Some of these high speed, high bandwidth applications may be video systems, such as those supported by the video protocol included in the VESA DisplayPort Standard, Version 1, Revision 1a of Jan. 11, 2008 for video data links (hereinafter DisplayPort, or DP), incorporated herein by reference in its entirety. High speed digital circuits may include current mode logic (CML) transceivers, intended to transmit data at speeds between 312.5 Mbit/s ($10^6$ bits per second) and 3.125 Gbit/s ($10^9$ bits per second). In CML transceivers, the transmission is usually terminated at the destination with 50Ω resistors on both differential lines. Due to their fast operation, CML transceivers are commonly used in video data links having high bandwidth such as DVI and HDMI video links. CML may also be used in interfaces with fiber optic components, and other telecommunication applications like serial data transceivers and frequency synthesizers.

Figure 1:
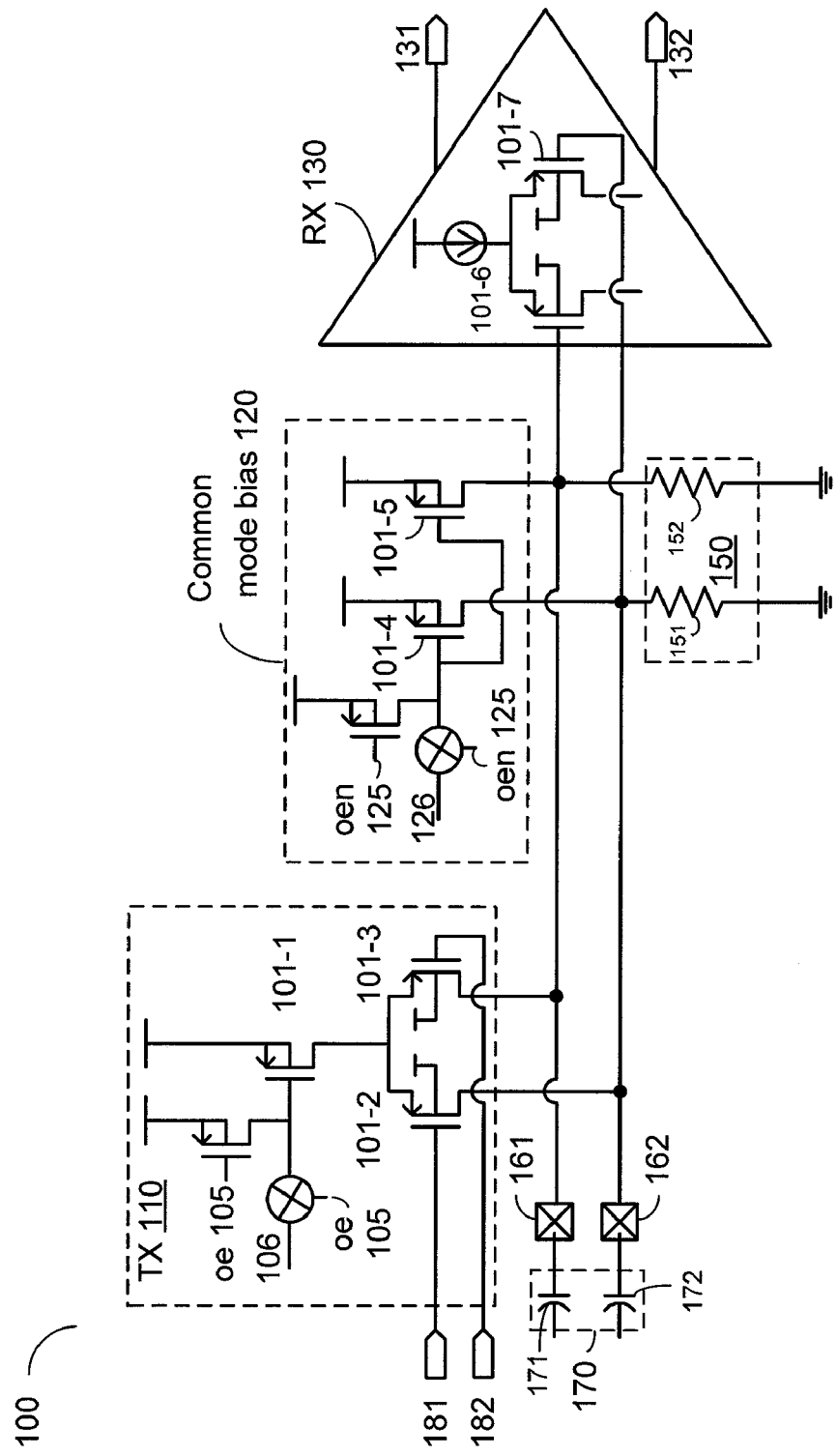
FIG. 1 shows an AC-coupled CML transceiver as described in the present specification.

FIG. 1 shows an example of an AC-coupled CML transceiver 100. Transceiver 100 may include transmitter block 110, common mode bias block 120, and receiver block 130, according to some embodiments of the present invention. Transceiver 100 may include an AC coupling block 170 having capacitors 171 and 172 to de-couple the dc signal coming from an off-chip circuit into transceiver 100. Capacitor 171 couples the input AC signal to pad 161, which may be the positive end of the differential signal according to some embodiments of the present invention. Likewise, capacitor 172 couples the input AC signal to pad 162, which may be the negative end of the differential signal according to some embodiments of the present invention. Pads 161 and 162 provide the connection of transceiver 100 to an off-chip circuit. Thus, a differential signal being received by block 130 may be initially coupled into circuit 100 through pads 161 and 162. Likewise, a differential signal produced by transmitter block 110 may be coupled out of circuit 100 through pads 161 and 162.

Block 110 includes an output enable signal ('oe') 105 and a first bias 106. Oe signal 105 turns transmitter 110 'on' when oe is 'high.' Mosfets 101-1, 101-2, and 101-3 are PMOS transistors: 101-1 provides current amplification, controlled by bias 106. PMOS 101-2 provides a voltage to negative pad 162, with its gate controlled by pin 181, and PMOS 101-3 provides a voltage to positive pad 161, with its gate controlled by pin 182. On-chip terminals 181 and 182 provide the differential signal to be transmitted out of transceiver 100 to an off-chip device. Pins 181 and 182 are thus connected to the circuit providing a differential signal to transceiver 100 to be transmitted to an off-chip device.

Oen signal 125 is the negation of 'oe' signal 105. That is, when 'oe' signal is high (or a digital '1'), 'oen' signal is low (digital '0'), and when 'oe' signal is low ('0') 'oen' signal is high ('1'). While 'oe' 105 activates transmitter block 110, 'oen' 125 activates common mode bias block 120 and receiver block 130. Block 120 provides an adjustable value for the common mode bias voltage of the differential signal being provided to transceiver 100 through pads 161 and 162. The bias voltage is controlled by second bias 126, which is coupled to the gates of PMOS transistors 101-4 and 101-5. Transistors 101-1 and 101-5 provide a current flow to resistor block 150, thus raising the voltage level associated to pads 161 and 162. In the embodiment depicted in FIG. 1, PMOS 101-4 is coupled to pad 162 and PMOS 101-5 is coupled to pad 161. The current provided to resistors 151 and 152 of resistor block 150 is the same, thus the adjustment of the voltage to pads 161 and 162 is made in 'common mode.'

In the embodiment depicted in FIG. 1, CML transceiver may be provided with a low voltage power supply (e.g. 2.5 V), for example in a half-duplex application. This means that the power supplies to all PMOS transistors and substrates shown in FIG. 1 are at the low voltage level. In this configuration, when the differential voltage Vpadp−Vpadn between positive end pad 161 voltage (Vpadp) and negative end pad 162 voltage (Vpadn) is less than the low voltage of the transceiver supply, receiver block 130 is not saturated. Thus, transceiver 100 performs according to specification. However, when pads 161 and 162 are connected to a circuit operating with a high-voltage supply (e.g. 5V), the voltage difference between pad 161 and pad 162 may go through a high-voltage swing (e.g. during a 'signal spike' or a transient voltage). In this situation, PMOS devices 101-1 through 101-7 may be over stressed and even fail. This failure may be a catastrophic short circuit generated by breakdown across some of the P-N junctions in one of the transistors. Furthermore the voltage differential between the low voltage power supplies of circuit 100 and a high-voltage swing signal may produce a short circuit through the PMOS substrates. PMOS substrates may be coupled to the low voltage power supply according to some embodiments of the present invention, as depicted in FIG. 1.

Receiver block 130 includes a current amplifier using PMOS 101-6 and 101-7. Receiver 130 collects the differential signal from pads 161 and 162, properly biased by block 120 so as not to saturate amplifier 130, and provides a differential output having a positive terminal 131 and a negative terminal 132. Output terminals 131 and 132 are coupled to the on-chip circuit of transceiver 100.

Figure 2:
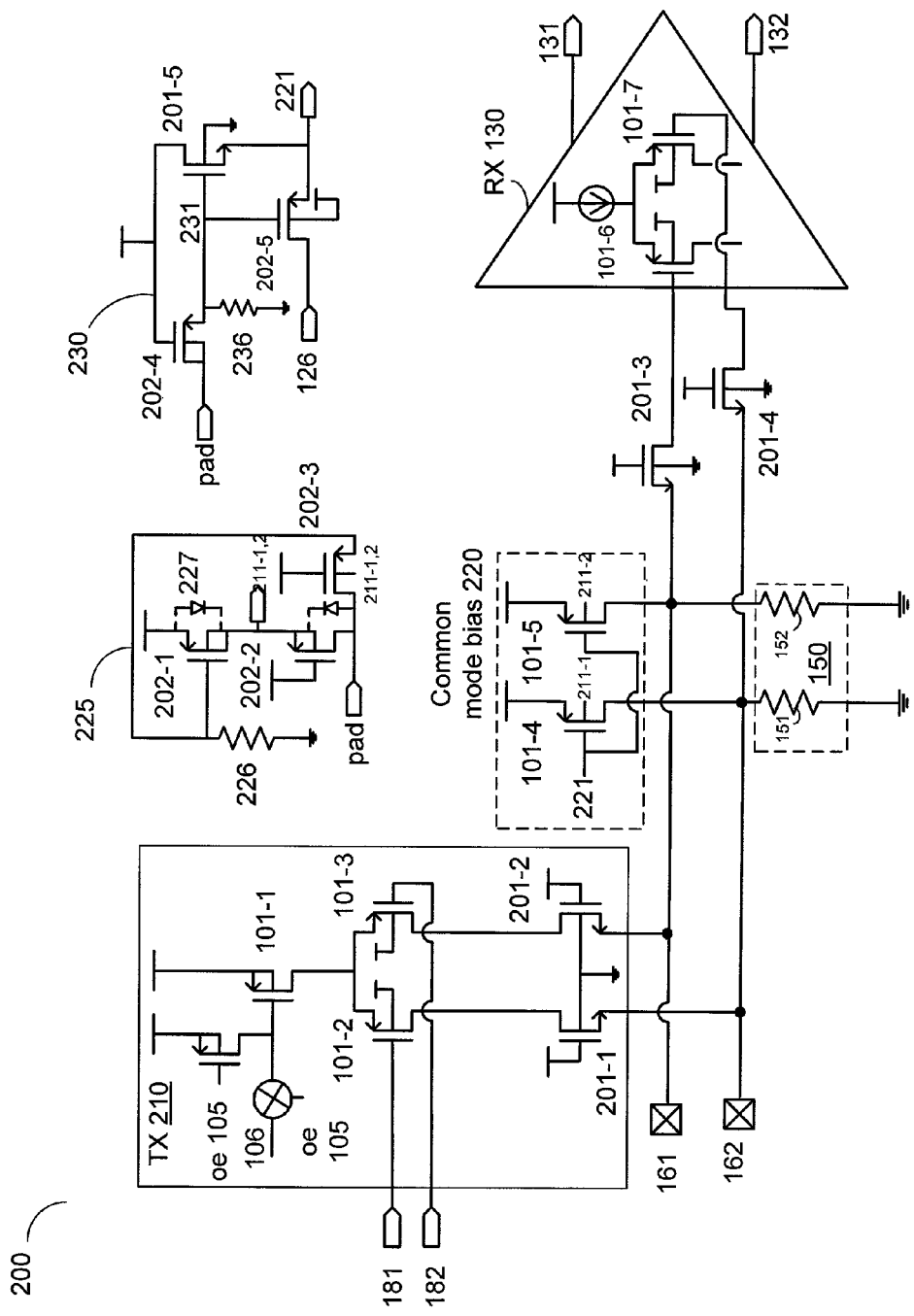
FIG. 2 shows a high-voltage tolerant, AC-coupled CML transceiver operating at low-voltage, according to some embodiments of the present invention.

FIG. 2 shows a high-voltage tolerant, AC-coupled CML transceiver 200 operating at low voltage, according to some embodiments of the present invention. Transceiver 200 includes transmitter block 210, common mode bias block 220, and receiver block 130. To provide high-voltage tolerance, transmitter block 210 may include NMOS transistors 201-1 and 201-2. The source of transistor 201-1 may be coupled to negative pad 162, and the source of transistor 201-2 may be coupled to positive pad 161 according to some embodiments of the present invention. Note that according to the embodiment depicted in FIG. 2, the two NMOS transistors 202-1 and 201-2 are coupled between the differential pair of transistors 101-2 and 101-3 and output pads 161 and 162. The gates of 201-1 and 201-2 are connected to the low voltage power supply of transceiver 200, which may be 2.5 V, in some embodiments of the present invention. The substrates of 201-1 and 201-2 are coupled to ground. Thus, the drain voltage of NMOS transistors 201-1 and 201-2 may be limited to a maximum value of the low voltage supply to transceiver 200, according to some embodiments of the present invention irrespective of the voltage swing across pads 161 and 162.

A similar result may be obtained from NMOS transistors 201-3 and 201-4 that may be placed between the input to receiver block 130 and the output pads 161 and 162. As in the case of NMOS 201-1 and 201-2, NMOS 201-3 and 201-4 have their gates coupled to the low power supply, for example 2.5V, according to some embodiments of the present invention. Further, the substrates of NMOS transistors 201-3 and 201-4 may be connected to ground. Thus, the input to circuit 130 is limited to less than the low voltage of the power supply to transceiver 200 because the drain voltage of NMOS transistors 201-3 and 201-4 is limited to the same voltage. In particular, according to the embodiment depicted in FIG. 2, the gate voltages to PMOS transistors 101-6 and 101-7 will be limited to less than the low voltage of the power supply to transceiver 200.

Further to provide high-voltage tolerance, block 220 may include circuit 225. Each of substrate voltages 211-1 and 211-2 may be provided by a separate substrate isolating circuit 225. Gate voltage 221 to PMOS transistors 101-4 and 101-5 may be provided by bias isolating block 230. The high-voltage tolerance may be provided for a voltage of 5V, according to some embodiments of the present invention.

Figure 3:
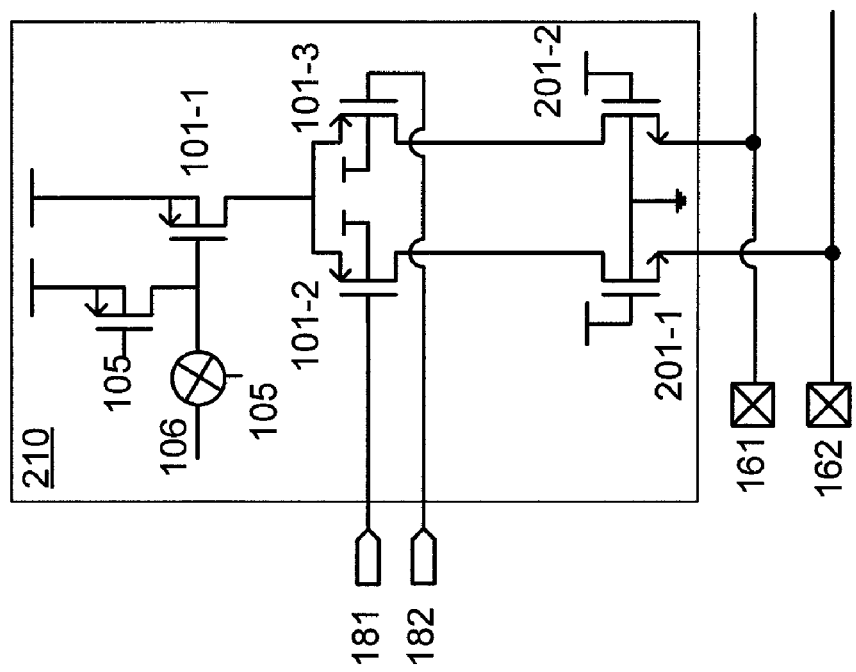
FIG. 3 shows a transmitter block in a high-voltage tolerant, AC-coupled CML transceiver operating at low-voltage, according to some embodiments of the present invention.

FIG. 3 shows a transmitter block in transceiver 200 operating at low voltage, according to some embodiments of the present invention. Further according to some embodiments of the present invention, a low voltage of operation for the transmitter block shown in FIG. 3 may be 2.5 V. As mentioned above, NMOS transistors 201-1 and 201-2 are coupled such that the gate of each transistor is coupled to the low voltage power supply and the substrate is coupled to ground, according to some embodiments of the present invention. As discussed above, this configuration may prevent the drain voltage in NMOS transistors 201-1 and 201-2 from reaching values grater than the low voltage of the power supply to transceiver 200. Thus, the terminals of PMOS transistors 101-2 and 101-3 are protected from potential swings in pads 161 and 162.

Figure 4:
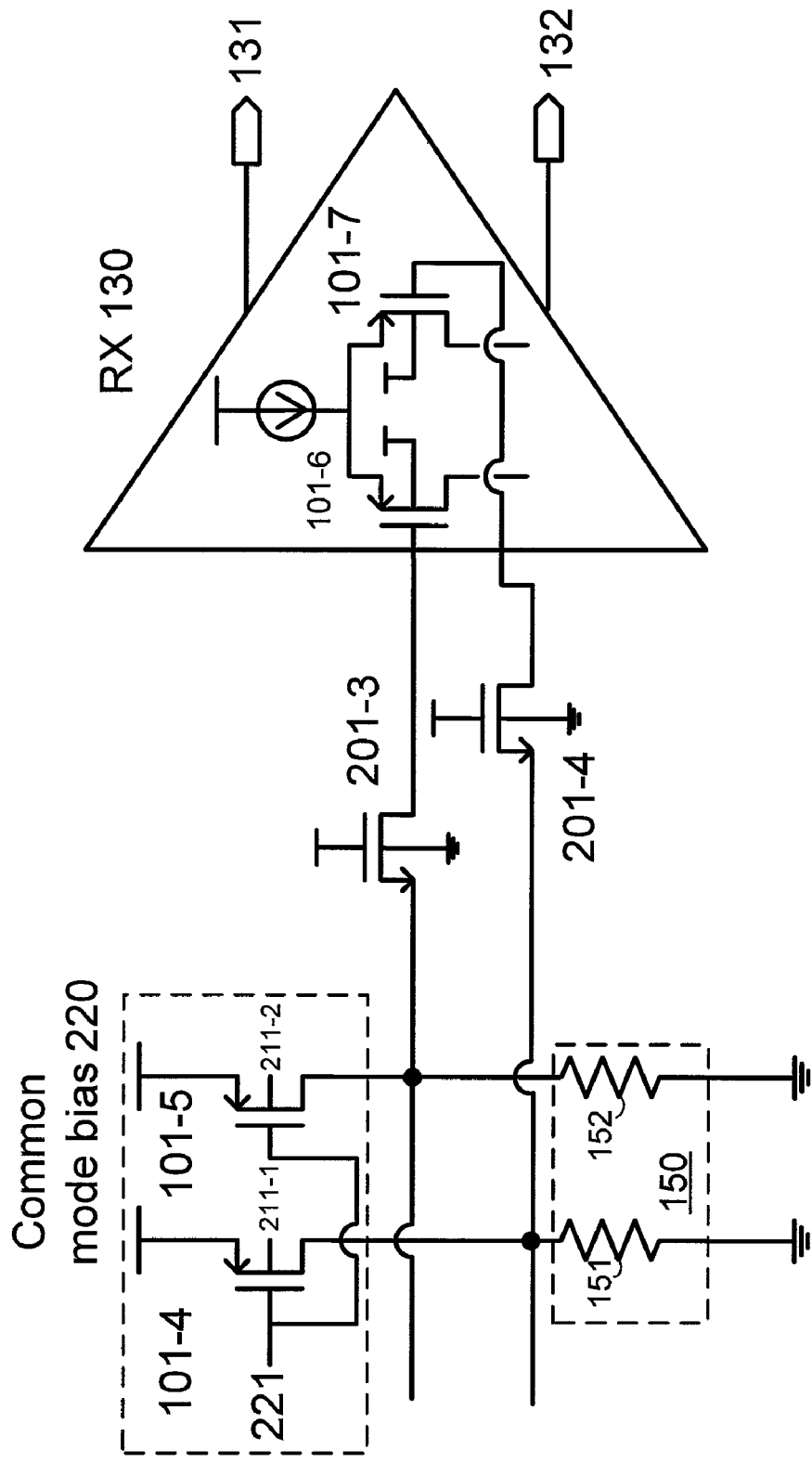
FIG. 4 shows a common mode bias block and a receiver block in a high-voltage tolerant, AC-coupled CML transceiver operating at low voltage, according to some embodiments of the present invention.

FIG. 4 shows a common mode bias block and a receiver block in a high-voltage tolerant, AC-coupled CML transceiver operating at a low voltage, according to some embodiments of the present invention. In some embodiments of the present invention, the high-voltage may be 5V, and the low voltage of operation of the CML transceiver may be 2.5 V. In FIG. 4 the substrates to PMOS transistors 101-4 and 101-5 are coupled to a voltage 211, while the gates of PMOS transistors 101-4 and 101-5 are coupled to a voltage 221. Voltage 211 and voltage 221 are adjusted accordingly, so as to prevent a short circuit of the substrate in PMOS 101-4 or 101-5 if a 5V swing occurs through pads 161 and 162. The details of how voltages 211 and 221 are configured as a function of voltages at pads 161 and 162 are shown in FIGS. 5a and 5b, as follows.

Figure 5A:
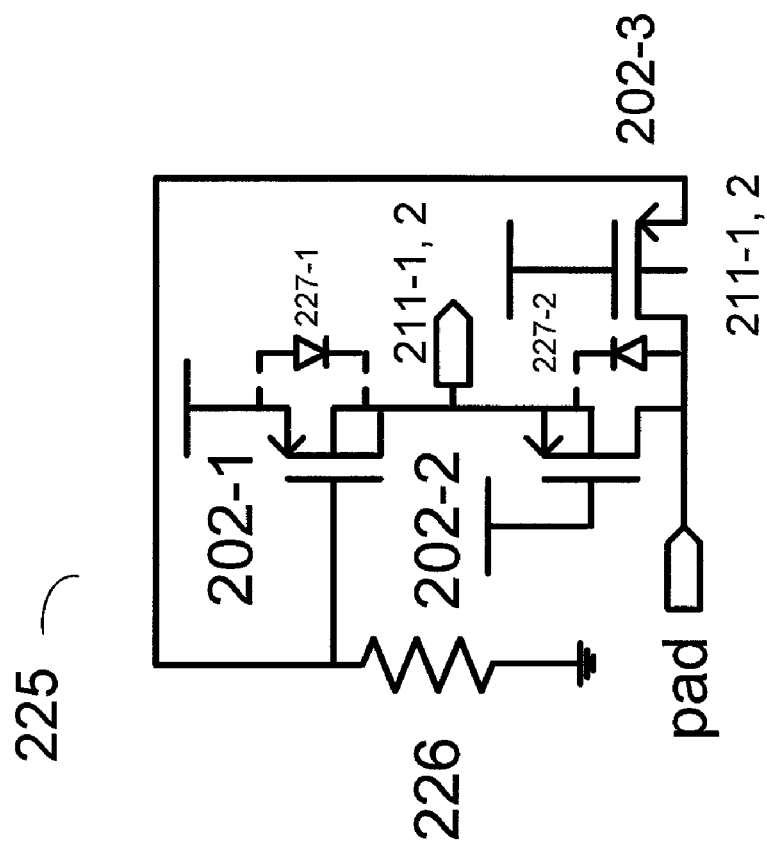
FIG. 5a shows a circuit to generate a substrate voltage in a common mode bias block, according to some embodiments of the present invention.

FIG. 5a shows circuit 225 to generate substrate voltages 211-1 and 211-2 for common mode bias block 220, according to some embodiments of the present invention. The circuit shown in FIG. 5a represents an embodiment to prevent a short circuit with the substrate of PMOS 101-4 and 101-5 when either of the voltages in pads 161 and 162 is greater than the low voltage of the supply to transceiver 200 (e.g. 2.5V). In some embodiments of the present invention, circuit 225 is a follower that makes voltage 211 equal to Vpad whenever the low-voltage of the power supply to transceiver 200 is lower than Vpad. Here, Vpad is the voltage of either pad 161 or 162. To achieve this result, circuit 225 may use PMOS transistors 202-1, 202-2, and 202-3 together with diodes 227, and resistor 226. If Vpad is lower than the low voltage of the power supply to transceiver 200, then PMOS transistors 202-2 and 202-3 are 'off', there is no current through resistor 226 and the gate of PMOS 202-1 is low. Thus, PMOS 202-1 is 'on' and pulls the value of voltage 211 equal to 2.5V (the power supply on circuit 225). If the low voltage (e.g. 2.5V) is lower than Vpad, and Vpad is lower than the high-voltage (e.g. 5V), then diode 227-2 is 'on', making voltage 211-1, 2 equal to Vpad. Moreover, when the low voltage is lower than Vpad, and Vpad is lower than the high-voltage (e.g. 5V) PMOS transistor 202-3 is 'on' (the gate voltage is lower than the substrate voltage), so the gate voltage in PMOS 202-1 is high, shutting 202-1 'off' and effectively disconnecting voltage 211-1, 2 from the low voltage power supply of circuit 225 (see diode 227-1). Thus, in the embodiments of circuit 225 shown in FIG. 5a, substrate voltages 211-1, 2 remain equal to the low voltage when Vpad is less than the low voltage, or follow Vpad when Vpad is higher, avoiding a short circuit with the power supply of transceiver 200 (at 2.5V).

Figure 5B:
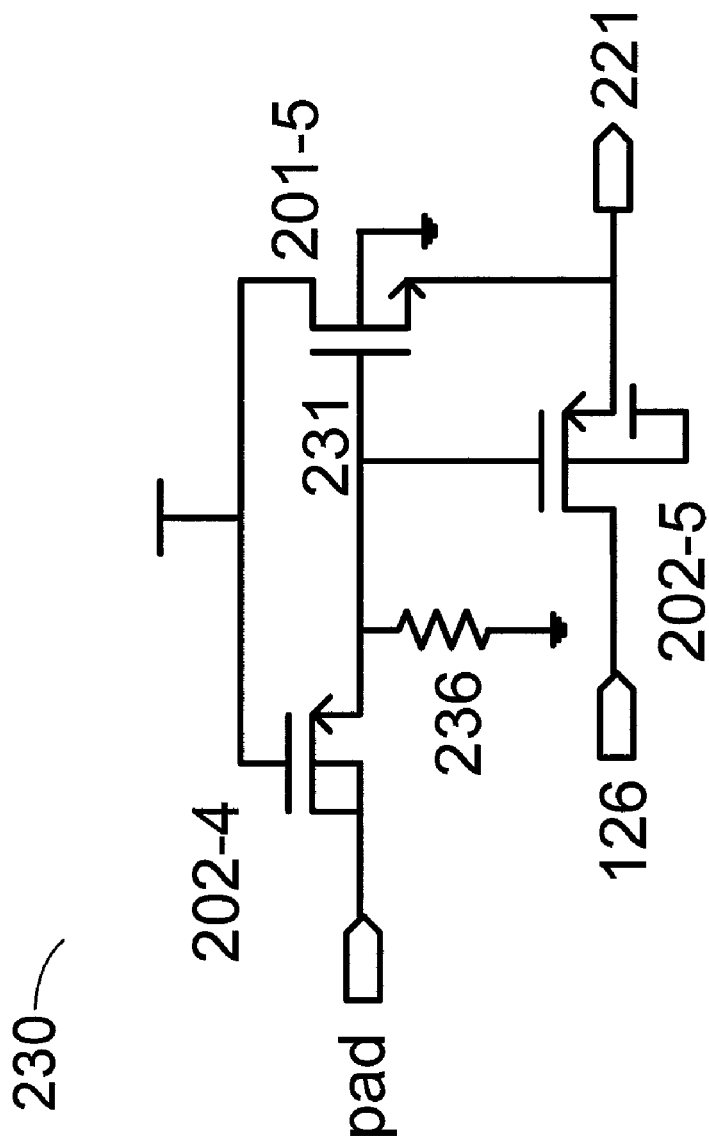
FIG. 5b. Shows a circuit to generate a gate voltage in a common mode bias block, according to some embodiments of the present invention.

FIG. 5b shows circuit 230 to generate gate voltage 221 for common mode bias block 220, according to some embodiments of the present invention. To achieve this, some embodiments such as that shown in FIG. 5a use PMOS transistors 202-4 and 202-5 in combination with NMOS 201-5, and resistor 236. Bias 126 is the same as shown in FIG. 1 for controlling the common mode bias voltage according to the embodiment depicted in FIG. 5b. If Vpad is less than the low voltage, then PMOS transistor 202-4 is 'off' (gate voltage, at the low voltage level, is higher than substrate), no current flows through resistor 236 and so voltage 231 is low. Therefore, gate voltage in NMOS 201-5 is low, so 201-5 is 'off' while 202-5 is 'on'. Thus, voltage 221 is equal to bias 126. This enables circuit 220 to regulate the common mode bias through bias 126. If eventually Vpad is between the low voltage and a high voltage value (e.g. 2.5V<Vpad<5V, according to some embodiments of the present invention), then PMOS transistor 202-4 is 'on' and gate voltage 231 is high due to the current drawn through resistor 236. Thus, NMOS 201-5 is 'on', pulling voltage 221 up to the low voltage of the supply to circuit 230. At the same time, bias 126 is disconnected from voltage 221 because PMOS 202-5 is turned 'off' when voltage 231 is high. The result of the embodiment of circuit 230 shown in FIG. 5b is a gate voltage 221 that follows bias 126 whenever Vpad is lower than the low voltage, and which is equal to the low voltage whenever Vpad goes beyond the low voltage, avoiding any short-circuit between the gates in common bias circuit 220 and bias 126.

It should be understood that, although a description of embodiments of the invention has been provided in the context of a transceiver circuit with common mode bias 220, embodiments of the invention may include only transmitter block 210 or receiver block 130. Further, some embodiments of the present invention may not include common mode bias 220.

Embodiments of the invention described above are exemplary only. One skilled in the art may recognize various alternative embodiments from those specifically disclosed. Those alternative embodiments are also intended to be within the scope of this disclosure. As such, the invention is limited only by the following claims.

What is claimed is:

1. A high voltage tolerant transceiver operating at a low voltage, the transceiver comprising:
    at least two input/output pads to receive a receive signal and transmit a transmit signal;
    a transmitter block to transmit the transmit signal;
    a receiver block to receive the receive signal and provide an amplified signal;
    at least one of the transmitter block and the receiver block further comprising at least two NMOS transistors having their gate coupled to a low power supply to receive the low voltage, their substrate coupled to ground, and their source coupled to the input/output pad.

2. The high voltage tolerant transceiver of claim 1 further comprising
    a common mode bias block to adjust the common mode voltage across the at least two input/output pads;
    a resistor block coupled to the common mode bias block to provide the common mode voltage to the input/output pads of the transceiver circuit;
    the common mode bias block further comprising
        a substrate isolating circuit, and a bias isolating circuit.

3. The high voltage tolerant transceiver of claim 1 wherein the high voltage is 5V and the low voltage is 2.5 V.

4. The high voltage tolerant transceiver of claim 1 wherein the transceiver is an AC-coupled, CML transceiver.

5. A circuit to isolate the output of a transmitter from high voltages comprising:
- a first transistor with substrate coupled to ground, gate coupled to a low voltage, source coupled to a positive output pad, and drain coupled to an output of the transmitter device; and
- a second transistor with substrate coupled to ground, gate coupled to a low voltage, source coupled to a negative output pad, and drain coupled to an output of the transmitter device.

6. The circuit of claim 5 wherein the high voltages are voltages between 2.5 V and 5 V.

7. A substrate isolating circuit, comprising:
- a first transistor with gate coupled through a resistor to ground and source coupled to a low voltage;
- a second transistor with gate coupled to the low voltage, source coupled to the drain of the first transistor, and drain coupled to a pad; and
- a third transistor with gate coupled to the low voltage, source coupled to the gate of the first transistor, and drain coupled to the pad;

wherein a substrate voltage is supplied by the drain of the first transistor, and the substrate voltage is isolated from a high voltage in the pad.

8. The circuit of claim 7 wherein the high voltages are voltages between 2.5 V and 5 V and the low voltage is 2.5 V.

9. A bias isolating circuit comprising:
- a first transistor with gate coupled to a low voltage, source coupled through a resistor to ground and drain coupled to a pad;
- a second transistor with gate coupled through the resistor to ground, drain coupled to an input bias voltage, and substrate coupled to the low voltage;
- a third transistor with gate coupled through the resistor to ground, drain coupled to the low voltage, and substrate coupled to ground;

wherein a bias voltage is supplied by the sources of the second and third transistors coupled together, and the input bias voltage is isolated from a high voltage in the pad.

10. The circuit of claim 9 wherein the high voltages are voltages between 2.5 V and 5V and the low voltage is 2.5V.

* * * * *